(12) United States Patent
Sasaki et al.

(10) Patent No.: US 8,610,151 B2
(45) Date of Patent: Dec. 17, 2013

(54) SEMICONDUCTOR LIGHT-EMITTING ELEMENT AND METHOD FOR MANUFACTURING SEMICONDUCTOR LIGHT-EMITTING ELEMENT

(75) Inventors: Chiharu Sasaki, Tokyo (JP); Wataru Tamura, Tokyo (JP); Keita Akiyama, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 133 days.

(21) Appl. No.: 13/415,206

(22) Filed: Mar. 8, 2012

(65) Prior Publication Data

US 2012/0228658 A1 Sep. 13, 2012

(30) Foreign Application Priority Data

Mar. 10, 2011 (JP) ................. 2011-052844

(51) Int. Cl.
*H01L 33/60* (2010.01)
(52) U.S. Cl.
USPC ............... 257/98; 257/94; 257/96; 257/102; 257/E33.063; 438/29
(58) Field of Classification Search
USPC .......... 257/94, 96, 98, 102, E33.063; 438/29
See application file for complete search history.

(56) References Cited

U.S. PATENT DOCUMENTS

| 5,811,839 A * | 9/1998 | Shimoyama et al. ........... 257/94 |
| 6,163,037 A * | 12/2000 | Matsumoto et al. .......... 257/101 |
| 7,652,281 B2 * | 1/2010 | Takahashi et al. ............. 257/13 |
| 2008/0268616 A1 * | 10/2008 | Sonoda et al. ................ 438/455 |

FOREIGN PATENT DOCUMENTS

| JP | 2008-053425 A | 3/2008 |
| JP | 2010-050318 A | 3/2010 |

* cited by examiner

*Primary Examiner* — Matthew W Such
*Assistant Examiner* — David Spalla
(74) *Attorney, Agent, or Firm* — Holtz, Holtz, Goodman & Chick, PC

(57) ABSTRACT

There is provided a light-emitting element having a semiconductor film which includes a p-type current-spreading layer of GaInP or GaP; a first p-clad of AlInP; a second p-clad of AlGaInP; an active layer including of GaInP or AlGaInP; a first n-clad having a carrier density of $1\times10^{18}$ cm$^{-3}$ to $5\times10^{18}$ cm$^{-3}$; a second n-clad having a carrier density of $1\times10^{18}$ cm$^{-3}$ to $5\times10^{18}$ cm$^{-3}$; wherein the thickness proportion of the first p-clad in an entire p-clad, is 50% to 80%; the thickness of an entire n-clad is equal to or greater than 2 μm; the thickness proportion of the first n-clad in the entire n-clad is equal to or greater than 80%; and the thickness of the second n-clad is equal to or greater than 100 nm.

6 Claims, 13 Drawing Sheets

SEMICONDUCTOR LIGHT-EMITTING ELEMENT AND METHOD FOR MANUFACTURING SEMICONDUCTOR LIGHT-EMITTING ELEMENT

BACKGROUND OF THE INVENTION

1. Technical Field

The present invention relates to light-emitting elements such as a light-emitting diode (LED).

2. Description of the Related Art

An AlGaInP-based LED has a layered structure in which, e.g., an n-clad layer, an active layer, and a p-clad layer made from AlGaInP are layered on an n-type GaAs substrate; a p-type current-spreading layer made from GaP is formed on the p-clad layer if required; and an electrode is formed on a surface of each of the GaAs substrate and the current-spreading layer. The n-clad layer and the p-clad layer have the composition ratio of Al and Ga adjusted so that the bandgap is greater than that of the active layer, and form a so-called double heterostructure.

Meanwhile, there has been proposed a structure in which, in order to make it possible to increase the brightness of the LED and allow the LED to be driven using a large current, the GaAs substrate used for crystal growth for a semiconductor film is removed, and an Si substrate is bonded onto the semiconductor film interposed by a light-reflecting layer. An Si substrate has a thermal conductivity that is higher than that of a GaAs substrate, which results in an improvement in heat-radiating performance, making it possible for the LED to be driven with a large current.

There are techniques disclosed in, for example, JP-A 2008-053425 (also referred to hereafter as Patent Reference 1) and JP-A 2010-50318 (also referred to hereafter as Patent Reference 2).

SUMMARY OF THE INVENTION

As the LED market expands, there is growing demand for a high-output LED in which a desired brightness can be obtained using a single LED chip. In an instance in which a light source device is configured using a plurality of LED chips, each of the LED chips is driven by a low current of, e.g., about 20 mA. In contrast, in order to obtain an equivalent brightness using a single LED chip, the chip must be driven at, e.g., 100 mA or above.

FIG. 1 shows results of studying the current-light output characteristics of a conventional LED in which a semiconductor film having the above-mentioned layer structure is layered onto a GaAs substrate. A 240 μm-square LED chip installed on a common bullet-shape or cannonball-shape stem (diameter 5 mm) is used as an evaluation sample.

In FIG. 1, the horizontal axis represents current density and the vertical axis represents relative values of the light emission intensity. As shown in FIG. 1, in a conventional LED, when the current density exceeds 40 A/cm² (or approximately 20 mA when converted to current), the light output ceases to change in a linear manner in response to an increase in injection current. In other words, the linearity of the current-light output characteristics decreases in a large-current region. Reasons include carrier overflow accompanying an increase in carrier density, and a decrease in efficiency accompanying generation of heat. It is difficult to use an LED having such characteristics with a large current exceeding 100 mA because use in a large-current region, in which linearity decreases, causes degradation in luminosity.

The problem of heat generation can be mitigated by bonding an Si substrate having a relatively high thermal conductivity onto a semiconductor film as described above, making it possible to drive the LED using a large current. However, a conventional LED generally has a configuration that has a GaAs substrate, driving with a large current has not been envisaged, and no considerations have been made with regards to the linearity of current-light output characteristics in a region of high current density (e.g., 100 A/cm² or above). Also, in a conventional LED, the GaAs substrate also fulfils the role of a current-spreading layer; therefore, a current-spreading function has not been considered necessary for the n-clad layer. In other words, until now, almost no investigations have been made with regards to the configuration of a semiconductor film optimized for a substrate-bonding structure. Against a background of an increase in demand for high-output LEDs and establishment of substrate-bonding technology, the linearity of current-light output characteristics in a large-current region has become an important topic of investigation.

With the foregoing issues in view, an object of the present invention is to provide a semiconductor light-emitting element in which the linearity of current-light output characteristics has been improved, and a method for manufacturing the semiconductor light-emitting element.

According to the present invention, there is provided a semiconductor light-emitting element including a support substrate and a semiconductor film provided on the support substrate, wherein the semiconductor film includes:

a current-spreading layer provided on the support substrate and made from GaInP or GaP having a p-type conductivity;

a first p-clad layer provided on the current-spreading layer and made from AlInP having a p-type conductivity; and a second p-clad layer provided on the first p-clad layer and made from AlGaInP having a p-type conductivity;

an active layer including at last one layer made from GaInP or AlGaInP, the active layer being provided on the second p-clad layer;

a first n-clad layer provided on the active layer and made from AlInP having a carrier density of $1\times10^{18}$ cm$^{-3}$ to $5\times10^{18}$ cm$^{-3}$ and an n-type conductivity; and a second n-clad layer provided on the first n-clad layer and made from AlGaInP having a carrier density of $1\times10^{18}$ cm$^{-3}$ to $5\times10^{18}$ cm$^{-3}$ and an n-type conductivity; wherein the proportion of the layer thickness of the first p-clad layer, in relation to the layer thickness of an entire p-clad layer comprising the first p-clad layer and the second p-clad layer, is 50% to 80%;

the layer thickness of an entire n-clad layer comprising the first n-clad layer and the second n-clad layer is equal to or greater than 2 μm;

the proportion of the layer thickness of the first n-clad layer in relation to the layer thickness of the entire n-clad layer is equal to or greater than 80%; and the layer thickness of the second n-clad layer is equal to or greater than 100 nm.

According to the present invention, there is provided a method for manufacturing a semiconductor light-emitting element, comprising the steps of:

forming, on a GaAs substrate, a second n-clad layer made from AlGaInP having a carrier density of $1\times10^{18}$ cm$^{-3}$ to $5\times10^{18}$ cm$^{-3}$ and an n-type conductivity;

forming, on the second n-clad layer, a first n-clad layer made from AlInP having a carrier density of $1\times10^{18}$ cm$^{-3}$ to $5\times10^{18}$ cm$^{-3}$ and an n-type conductivity type;

forming, on the first n-clad layer, an active layer including at least one layer made from GaInP or AlGaInP;

forming, on the active layer, a second p-clad layer made from AlGaInP having a p-type conductivity;

forming, on the second p-clad layer, a first p-clad layer made from AlInP having a p-type conductivity;

forming, on the first p-clad layer, a current-spreading layer made from GaInP or GaP having a p-type conductivity;

forming, on the current-spreading layer, a reflective electrode layer having a light-reflecting structure;

bonding, onto the reflective electrode layer, a support substrate made from a material having a higher thermal conductivity than that of the GaAs substrate;

removing the GaAs substrate; and forming an upper-surface electrode on a surface of the second n-clad layer, the surface being exposed by the removal of the GaAs substrate; wherein the proportion of the layer thickness of the first p-clad layer, in relation to the layer thickness of an entire p-clad layer comprising the first p-clad layer and the second p-clad layer, is 50% to 80%;

the layer thickness of an entire n-clad layer comprising the first n-clad layer and the second n-clad layer is equal to or greater than 2 µm;

the proportion of the layer thickness of the first n-clad layer in relation to the layer thickness of the entire n-clad layer is equal to or greater than 80%; and the layer thickness of the second n-clad layer is equal to or greater than 100 nm.

According to the present invention, it is possible to provide a semiconductor light-emitting element in which the linearity of current-light output characteristics has been improved.

DETAILED DESCRIPTION OF THE INVENTION

Figure 1:
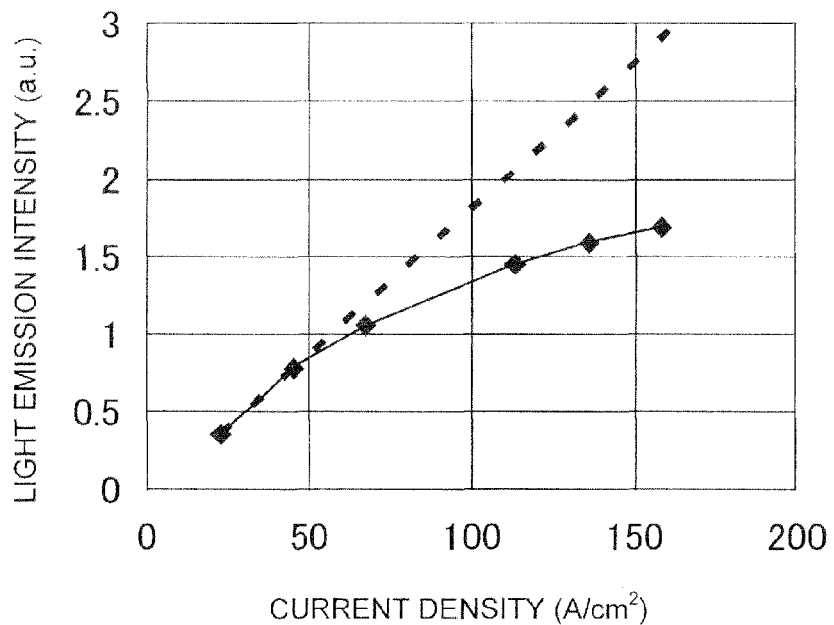
FIG. 1 shows current-light output characteristics of an optical semiconductor element having a conventional structure.

A preferred embodiment of the invention is described below with reference to the attached drawings. In each of the drawings, constituent elements or portions that are substantively identical or equivalent are affixed with identical reference numerals.

[Configuration of Semiconductor Light-Emitting Element]

Figure 2:
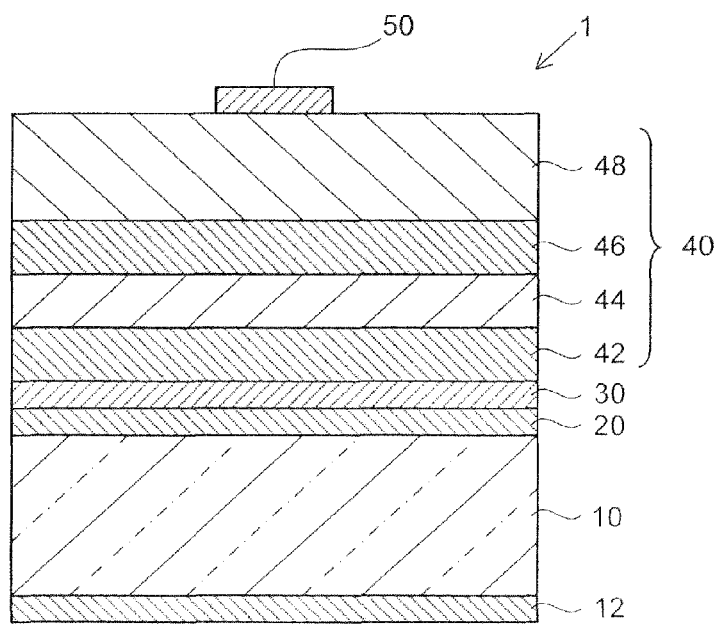
FIG. 2 is a schematic cross-section view showing a configuration of a semiconductor light-emitting element according to an embodiment of the invention.
Figure 3:
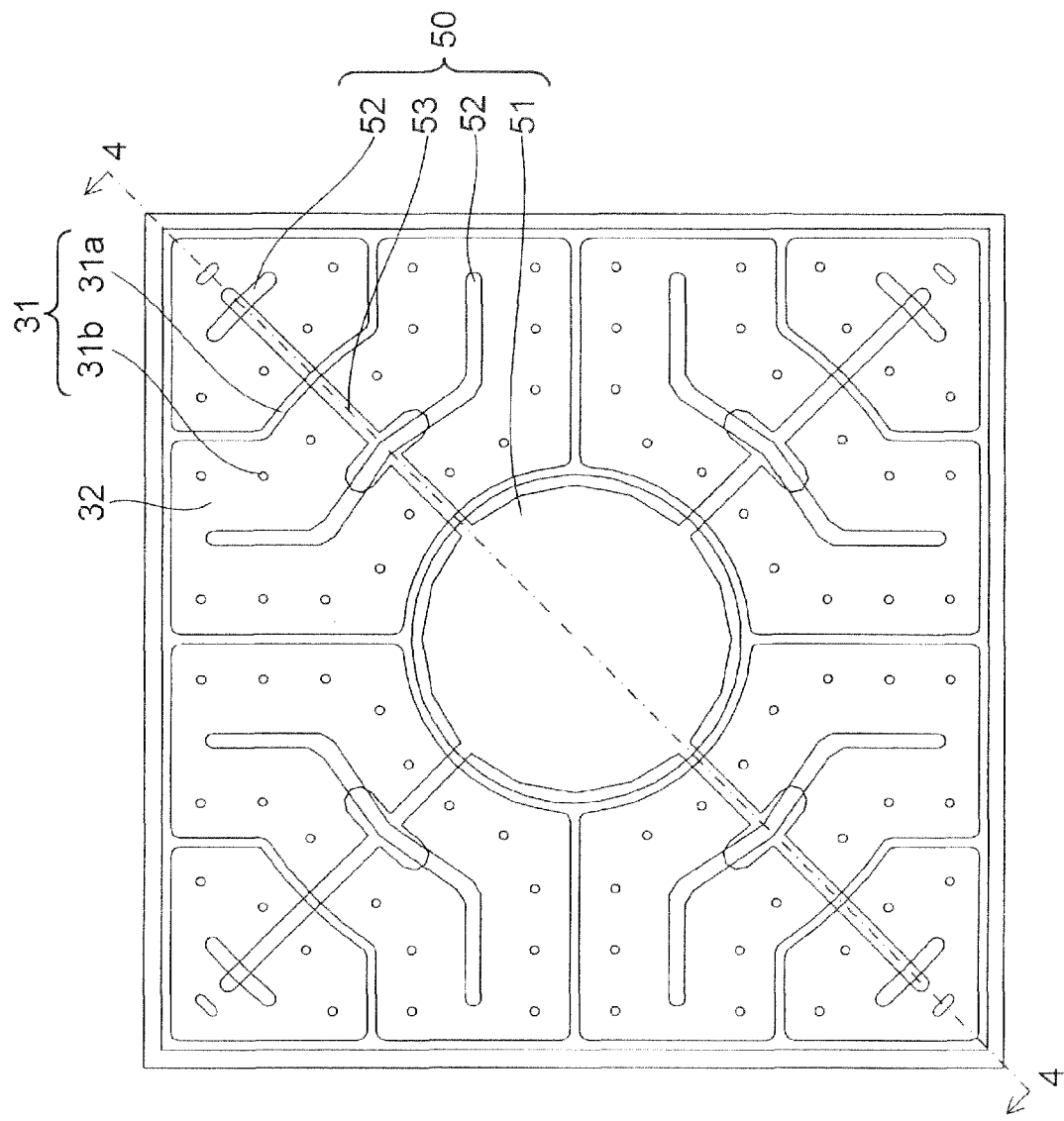
FIG. 3 is a plan view showing an arrangement of an upper-surface electrode and a reflective electrode according to the embodiment of the invention.
Figure 4:
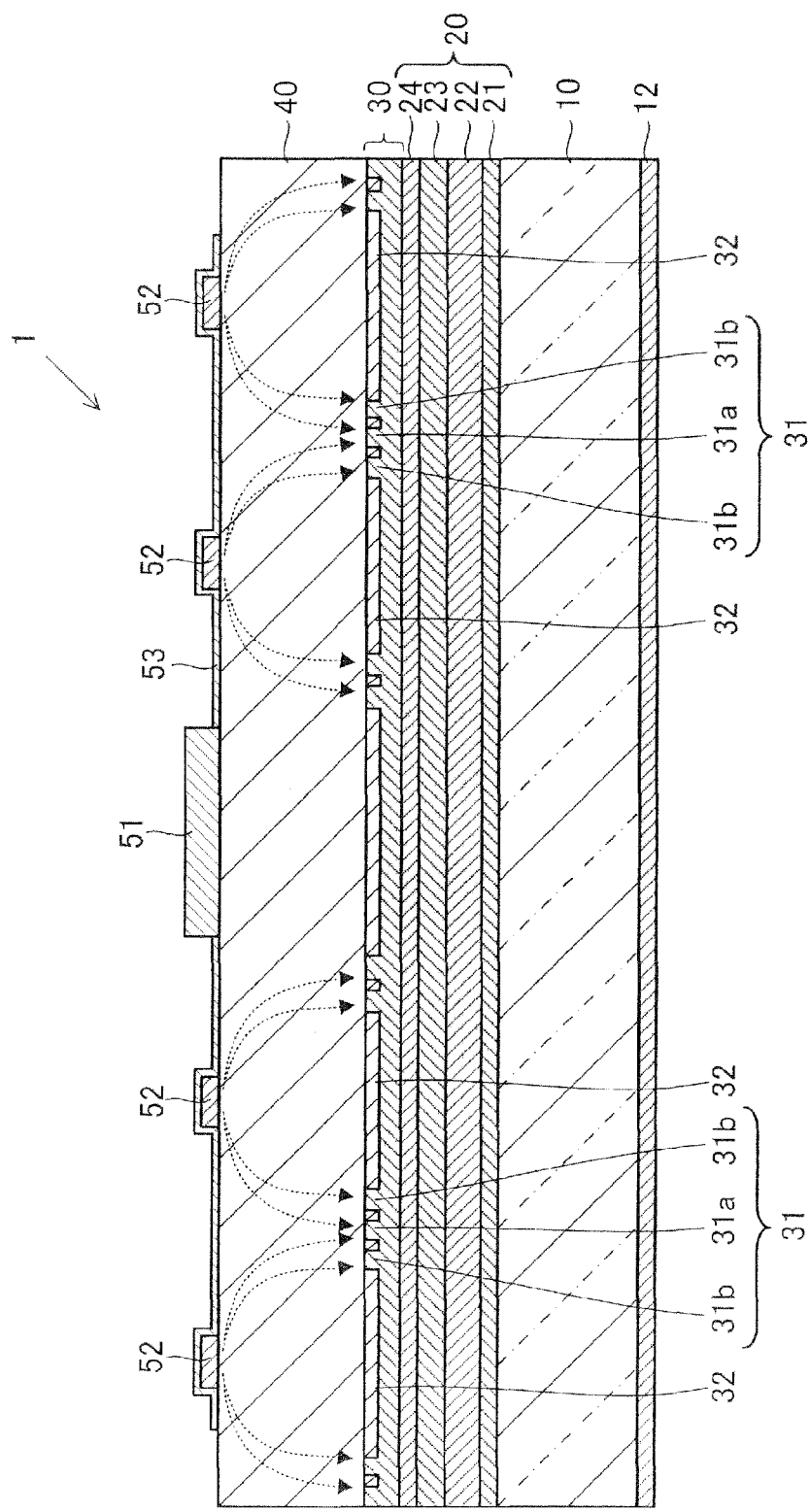
FIG. 4 is a cross-section view showing a configuration of a semiconductor light-emitting element according to the embodiment of the invention.

FIG. 2 is a schematic cross-section view showing a configuration of a semiconductor light-emitting element 1 according to an embodiment of the invention. FIG. 3 is a plan view in which an upper-surface electrode 50 and a reflective electrode 31 forming a reflective electrode layer 30 are projected onto a single plane parallel to the semiconductor film. FIG. 4 is a cross-section view showing a more detailed configuration of a junction layer 20, the reflective electrode layer 30, and the upper-surface electrode 50; and is a cross-section view along line 4-4 in FIG. 3.

In the semiconductor light-emitting element 1, a semiconductor film 40 is provided on a support substrate 10 with the junction layer 20 and the reflective electrode layer 30 interposed therebetween. The upper-surface electrode 50 is provided on the semiconductor film 40, and a reverse-surface electrode 12 is provided on a reverse surface of the support substrate 10.

The support substrate 10 is a Si substrate having an n-type conductivity and a thickness of approximately 200 µm. The thermal conductivity of the Si substrate is 148 W/m·K, which is higher than the thermal conductivity of a GaAs substrate used for crystal growth for the semiconductor film 40 (54 W/m·K). Therefore, it becomes possible to transmit heat generated by the semiconductor film 40 to the exterior in an efficient manner, and it becomes possible to drive an LED with a large current.

The junction layer 20 is configured from an ohmic layer 21, which is made from Pt and is in ohmic contact with the support substrate 10; an adhesion layer 22 made from Ti; a eutectic bonding layer 23 configured by laminating AuSn and Ni; and a barrier layer 24 configured by laminating TaN, TiW, and TaN.

The reflective electrode layer 30 is provided between the junction layer 20 and the semiconductor film 40. The reflective electrode layer 30 forms, at an interface with the semiconductor film 40, a light-reflecting surface for reflecting light radiated from an active layer towards a light-extraction-surface side; and also functions as an electrode for supplying an electrical current to the semiconductor film 40. The reflective electrode layer 30 is configured from the reflective electrode 31 made from AuZn and a dielectric layer 32 made from $SiO_2$. The reflective electrode 31 is in ohmic contact with the semiconductor film 40 at opening portions in the dielectric layer 32. The dielectric layer 32 divides the reflective electrode 31 into line-shaped line electrodes 31a and island-shaped dot electrodes 31b. The line electrodes 31a and the dot electrodes 31b are linked below the dielectric layer 32 and are electrically connected.

A Schottky electrode 51, ohmic electrodes 52, and a connection wiring 53 forming the upper-surface electrode 50 are formed on a surface of the semiconductor film 40 that serves as the light extraction surface. The Schottky electrode 51 forms a bonding pad, and is configured from a material that is capable of forming a Schottky contact with the semiconductor film 40, such as Ta, Ti, W, or an alloy thereof. The Schottky electrode 51 is formed at a substantially central position of the semiconductor film, and has an electroconductive wire for supplying an electrical current from the exterior connected thereto. Each of the ohmic electrodes 52 is made from a material that is capable of forming an ohmic contact with the semiconductor film 40, such as AuGeNi, AuSn, AuSnNi, or a similar material. The Schottky electrode 51 and each of the ohmic electrodes 52 are electrically connected by the connection wiring 53 that links both electrodes. The connection wiring 53 is configured from a material that is capable of forming a Schottky contact with the semiconductor film 40, such as Ta, Ti, W, or an alloy thereof; the same material as that used for the Schottky electrode 51 can be used. Electrical current flows between the ohmic electrodes 52 on the light-extraction-surface side and the line electrodes 31$a$ and the dot electrodes 31$b$ on the light-reflecting-surface side. Paths along which the electrical current flows through the semiconductor film 40 are shown by arrows in FIG. 3.

The ohmic electrodes 52 on the light-extraction-surface side and the line electrodes 31$a$ and the dot electrodes 31$b$ on the light-reflecting-surface side are arranged so that no overlapping is present between each other when viewed along the direction of lamination or layering of the semiconductor film 40 (i.e., the direction vertical to the semiconductor film 40) or when the ohmic electrodes 52 and the electrodes 31$a$ and 31$b$ are projected onto a single plane parallel to the semiconductor film 40. An above-described electrode configuration makes it possible to prevent current concentration and achieve uniformity in the current density distribution in the semiconductor film, even in an instance in which the semiconductor film has a relatively small thickness (e.g., about 5 μm). It is thereby possible to obtain a uniform light-emission distribution, as well as to prevent localization of heat generation and concentration of an electrical field and to ensure a high degree of reliability. Also, reducing the thickness of the semiconductor film 40 makes it possible to reduce the forward voltage Vf.

The semiconductor film 40 is configured by stacking a current-spreading layer 42 made from GaP having a p-type conductivity type; a p-clad layer 44 having a p-type conductivity type; an active layer 46 having a multiple quantum well structure made from AlGaInP; and an n-clad layer 48 having an n-type conductivity type. The semiconductor light-emitting element 1 does not have a substrate for growing the semiconductor film 40; therefore, the n-side ohmic electrodes 52 are formed on the n-clad layer 48.

In order to improve the linearity of current-light output characteristics, it is necessary to minimize carrier overflow. For example, in an instance of use in a large-current region of over 100 mA, it is necessary to increase the capability of blocking both electrons and holes in each of the n-clad layer and the p-clad layer. The inventors investigated the configuration of the p-clad layer 44 and the n-clad layer 48 in order to improve the linearity of current-light output characteristics in a large-current region for a semiconductor light-emitting element 1 having the configuration described above.

[Investigation of n-Clad Layer]

The inventors investigated the configuration of the n-clad layer 48 in order to improve the linearity of current-light output characteristics in a large-current region. The configuration other than that of the n-clad layer 48 is configured as follows. The active layer 46 was configured as a multiple quantum well structure in which a well layer having a thickness of approximately 10 nm and being made from $(Al_{0.1}Ga_{0.9})_{0.5}In_{0.5}P$, and a barrier layer having a thickness of approximately 10 nm and being made from $(Al_{0.5}Ga_{0.5})_{0.5}In_{0.5}P$, were repeatedly layered for 20 cycles. The p-clad layer 44 was configured from $(Al_{0.7}Ga_{0.3})_{0.5}In_{0.5}P$ having a carrier density of $2\times10^{17}$ cm$^{-3}$ and a thickness of approximately 1 μm. The current-spreading layer 42 was configured from GaP having a carrier density of $3\times10^{18}$ cm$^{-3}$ and a thickness of approximately 1 μm.

Since the semiconductor light-emitting element 1 does not have a GaAs substrate that also has a current-spreading function, the n-clad layer 48 requires, in addition to the function of blocking carriers, a function of promoting current spreading. If current spreading within the semiconductor film 40 is insufficient, current concentration will occur, resulting not only in a decrease in the linearity of current-light output characteristics, but in an increase in brightness unevenness and the forward voltage Vf. For the n-clad layer 48 to also function as a current-spreading layer, it is necessary to optimize the thickness and the carrier density of the n-clad layer 48. In order to search for an optimum value for each of the thickness and the carrier density of the n-clad layer 48, the inventors created samples of three types between which the carrier density and layer thickness of the n-clad layer 48 differ, and studied the light-emission distribution (i.e., brightness distribution on a light-emitting surface) for each of the samples. The light-emission distribution is substantially consistent with the current density distribution in the semiconductor film; therefore, studying the light-emission distribution makes it possible to identify the state of current-spreading in the semiconductor film. Specifically, if the light-emission distribution is uniform, it can be determined that current-spreading is being promoted.

The n-clad layer in each of the three types of samples was configured as follows. For sample A, the thickness of the n-clad layer 48 was 1 μm and the carrier density was $2\times10^{17}$ cm$^{-3}$. For sample B, the thickness of the n-clad layer 48 was 1 μm, and the carrier density was $1\times10^{18}$ cm$^{-3}$. For sample C, the thickness of the n-clad layer 48 was 2 μm, and the carrier density was $1\times10^{18}$ cm$^{-3}$. The support substrate 10 made from Si was bonded to the semiconductor film 40; the GaAs substrate used for crystal growth was removed; the upper-surface electrode 50 and the reverse-surface electrode 12 were formed; and the resulting wafer was cut out into 330-μm-square LED chips. An LED chip created as described above was mounted on a common bullet-shape LED stem having a diameter of 5 mm, and the resulting assembly was used as an evaluation sample.

Figure 5:
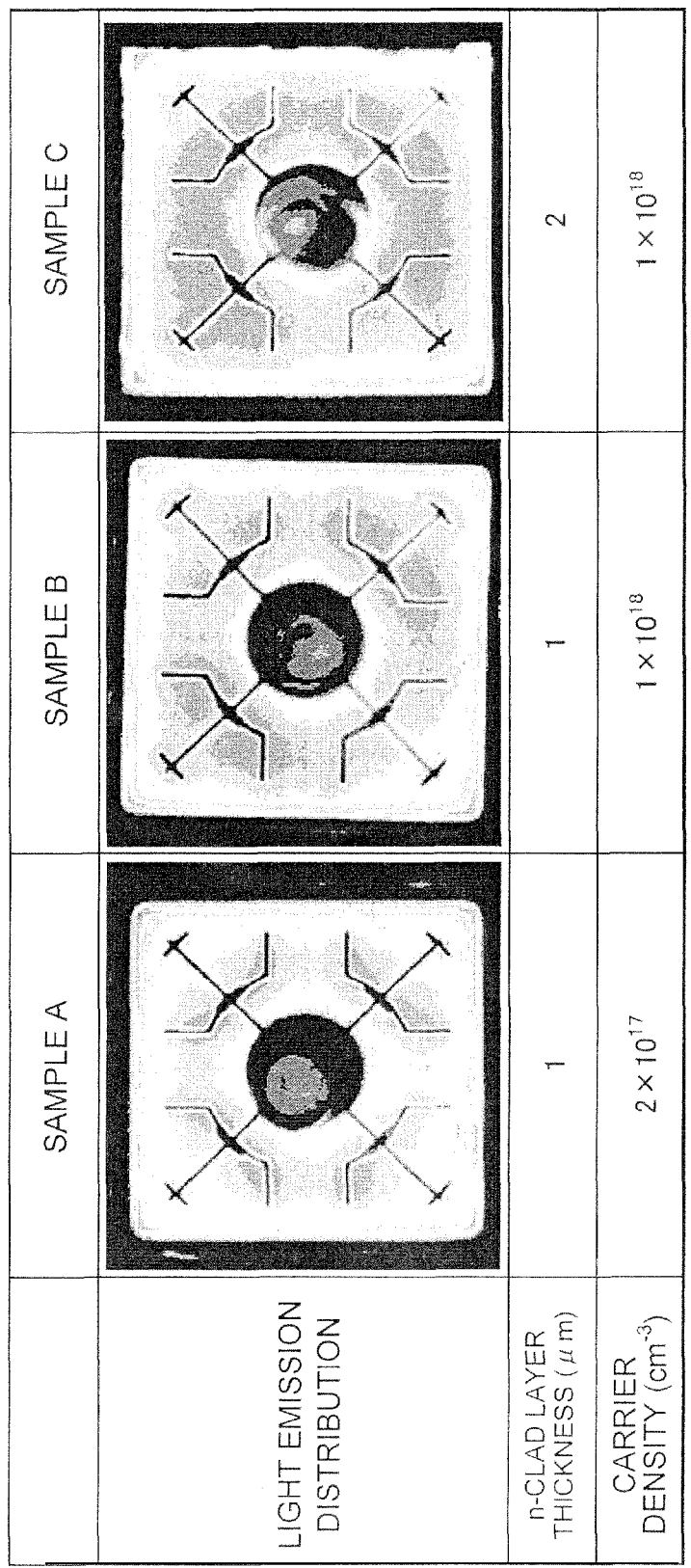
FIG. 5 shows the light-emission distribution of three sample types between which the n-clad layer configuration mutually differs.

FIG. 5 shows the result of studying the light-emission distribution of each of the above-mentioned samples. In FIG. 5, the magnitude of light emission intensity is expressed by the darkness of coloration; a darker-colored portion indicates a higher emission intensity. In sample A, it was observed that the brightness and the carrier density of corner portions of the chip were lower. In sample B, it was observed that the brightness and the carrier density of corner portions of the chip were improved compared to sample A, and that increasing the carrier density to $1\times10^{18}$ cm$^{-3}$ promotes current-spreading. However, the current is concentrated near the ohmic electrodes to generate a high-brightness region. In sample C, it was observed that having the n-clad layer 48 be 2 μm in thickness has further promoted current-spreading and moderated the current concentration near the ohmic electrodes. From the results above, it was observed that having the thickness of the n-clad layer 48 be equal to or greater than 2 μm and the carrier density be equal to or greater than $1\times10^{18}$ cm$^{-3}$ makes it possible to increase the function, of the n-clad layer 48, of promoting current-spreading. However, although increasing the carrier density promotes current-spreading, it also increases the amount of light that is absorbed, causing a decrease in light output. Therefore, the carrier density is preferably equal to or less than $5\times10^{18}$ cm$^{-3}$.

Next, the inventors investigated the composition of the n-clad layer 48 in order to improve the linearity of current-light output characteristics. The n-clad layer 48 was configured as a two-layer configuration, where $Al_{0.5}In_{0.5}P$ was used for the active-layer 46 side (i.e., first n-clad layer), and $(Al_{0.7}Ga_{0.3})_{0.5}In_{0.5}P$ was used for a light-extraction-surface side (i.e., second n-clad layer). The proportion of the layer thickness of each of the layers was varied, and the linearity of the current-light output characteristics was evaluated. From the above-mentioned results, 2 μm was used for the total layer thickness of the first n-clad layer and the second n-clad layer. The following indicator value Rd was used in evaluating the linearity of the current-light output characteristics. Specifically, an ideal value for light output at 100 A/cm$^2$ was calculated from the current-light output characteristics in a low-current-density region (60 A/cm$^2$ or less) at which relatively good linearity is exhibited, and a proportion of the actually measured value of the light output at 100 A/cm$^2$ relative to the ideal value (actually measured value/ideal value) was used as the indicator value Rd. An indicator value Rd nearer to 1 can be determined to represent better linearity.

Figure 6:
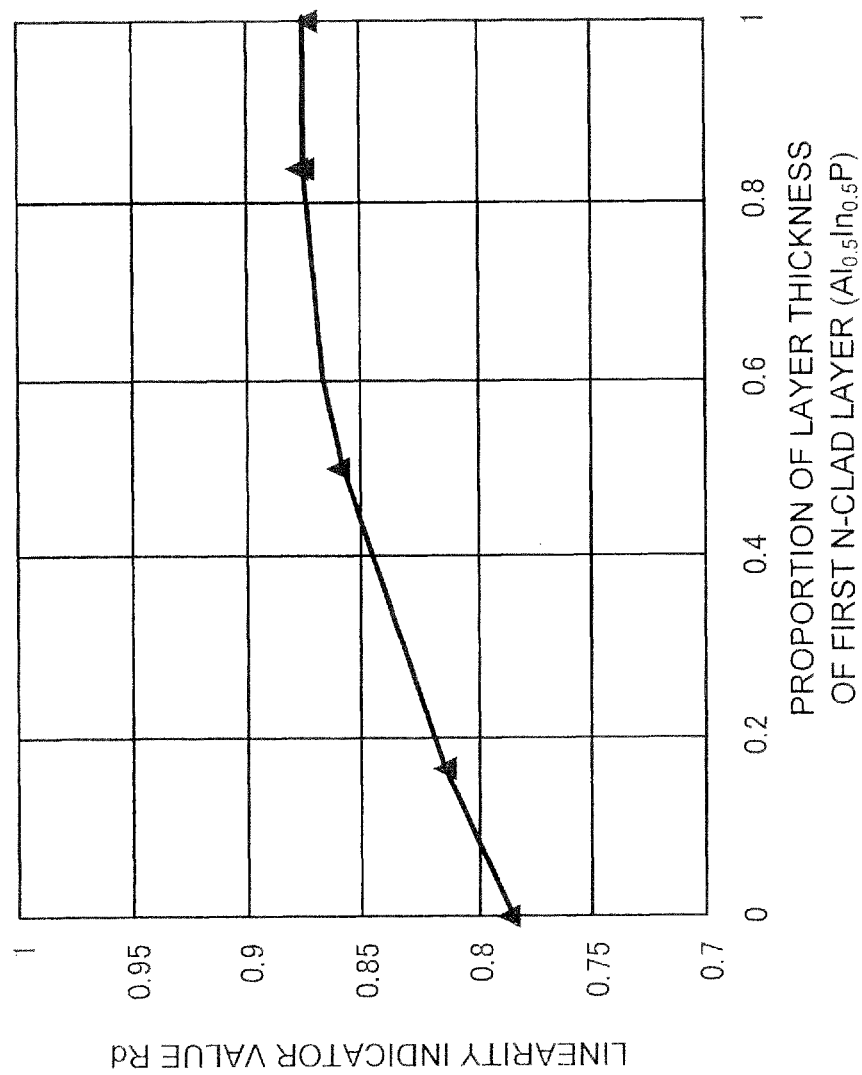
FIG. 6 shows a relationship between the proportion of the layer thickness of a first n-clad layer and a value indicating the linearity of light output.

FIG. 6 shows a relationship between the proportion of the layer thickness of the first n-clad layer ($Al_{0.5}In_{0.5}P$) and the indicator value Rd, where the first n-clad layer is the layer, adjacent to the active layer, of the n-clad layer 48 having a two-layer configuration. As shown in FIG. 6, a trend was observed in that the linearity improves with an increase in the proportion of the layer thickness of the first n-clad layer ($Al_{0.5}In_{0.5}P$). Also, no change in linearity was observed once the proportion of the layer thickness of the first n-clad layer ($Al_{0.5}In_{0.5}P$) exceeded 80%. From the above results, it was observed that having the proportion of the layer thickness of the first n-clad layer ($Al_{0.5}In_{0.5}P$) as part of the n-clad layer 48 be equal to or greater than 80% increases the carrier block function (or overflow-minimizing function) of the n-clad layer 48, making it possible to improve the linearity of the current-light output characteristics.

In a semiconductor light-emitting element in which support substrates having a high thermal conductivity are bonded together such as in the present embodiment, since the GaAs substrate used for crystal growth for the semiconductor film is removed, the n-clad layer 48 is exposed as an outermost surface. Since the $Al_{0.5}In_{0.5}P$ layer forming the first n-clad layer is readily oxidized, it is undesirable for the $Al_{0.5}In_{0.5}P$ layer to be exposed as the outermost surface of the semiconductor film. Also, if the $Al_{0.5}In_{0.5}P$ layer is formed adjacent to the GaAs substrate, during an etching step when removing the GaAs substrate, the $Al_{0.5}In_{0.5}P$ layer will also be etched, and the LED structure will be destroyed. Therefore, the outermost surface of the semiconductor film 40 requires a second n-clad layer made from a material that is not readily oxidized, is resistant to an etchant used to remove the GaAs substrate, and does not readily absorb light from the active layer. In order for the second n-clad layer to have such characteristics, it is preferable that the composition of the second n-clad layer is $(Al_1Ga_{1-y})_{0.5}In_{0.5}P$ (where y<1) and the layer thickness is equal to or greater than 100 nm. Taking absorption of light into account, it is further preferable that $0.3 \leq y \leq 0.7$.

The above results show that setting the total layer thickness of the first and the second n-clad layers to be equal to or greater than 2 μm, setting the carrier density to $1\times10^{18}$ cm$^{-3}$ to $5\times10^{18}$ cm$^{-3}$, setting the proportion of the layer thickness of the first n-clad layer ($Al_{0.5}In_{0.5}P$) adjacent to the active layer 46 to be equal to or greater than 80%, and setting the layer thickness of the second n-clad layer $(Al_yGa_{1-y})_{0.5}In_{0.5}P$ (where y<1)) on the light-extraction-surface side to be equal to or greater than 100 nm, make it possible to configure an n-clad layer in which the linearity of the current-light output characteristics can be improved while current-spreading is promoted.

[Investigation of p-Clad Layer]

The inventors investigated the layer composition of the p-clad layer 44 in order to improve the linearity of the current-light output characteristics in a large-current region. The configuration other than that of the p-clad layer 44 was configured as follows. The active layer 46 was configured as a multiple quantum well structure in which a well layer having a thickness of approximately 10 nm and being made from $(Al_{0.5}Ga_{0.5})_{0.5}In_{0.5}P$, and a barrier layer having a thickness of approximately 10 nm and being made from $(Al_{0.5}Ga_{0.5})_{0.5}In_{0.5}P$, were repeatedly layered for 20 cycles. The n-clad layer 48 was configured as a two-layer configuration comprising a first n-clad layer adjacent to the active layer, and a second n-clad layer arranged on the light-extraction-surface side, the first n-clad layer being made from $Al_{0.5}In_{0.5}P$ having a carrier density of $1\times10^{18}$ cm$^{-3}$ and a thickness of approximately 1.6 μm, and the second n-clad layer being made from $(Al_{0.7}Ga_{0.3})_{0.5}In_{0.5}P$ having a carrier density of $1\times10^{18}$ cm$^{-3}$ and a thickness of approximately 0.4 μm. The current-spreading layer 42 was configured from GaP having a carrier density of $3\times10^{18}$ cm$^{-3}$ and a thickness of approximately 1 μm.

Since the p-clad layer 44 is provided adjacent to the current-spreading layer 42, which has a high carrier density, there is little need for the p-clad layer 44 to be provided with a function of promoting current-spreading. Therefore, a layer thickness of the p-clad layer 44 of about 1 μm is thought to be sufficient. Also, an impurity used to obtain a p-type conduction type (e.g., Mg) readily diffuses in the active layer 46, and the p-type impurity diffused in the active layer 46 functions as a nonradiative center if the doping density is too high; therefore, it is preferable that the doping density (carrier density) is equal to or less than $1\times10^{18}$ cm$^{-3}$.

With the foregoing in view, the inventors created samples of two types (sample D, sample E) whose composition of the p-clad layer 44 differ, and obtained current-light output characteristics for each of the samples. In the samples of two types, the configuration of the p-clad layer 44 was as follows. In sample D, the p-clad layer 44 was configured from a single layer of $Al_{0.5}In_{0.5}P$ having a carrier density of $2\times10^{17}$ cm$^{-3}$ and a thickness of 1 μm. In sample E, the p-clad layer 44 was configured from a single layer of $(Al_{0.7}Ga_{0.3})_{0.5}In_{0.5}P$ having a carrier density of $2\times10^{17}$ cm$^{-3}$ and a thickness of 1 μm. The support substrate 10 made from Si was bonded to the semiconductor film 40; the GaAs substrate used for crystal growth was removed; the upper-surface electrode 50 and the reverse-surface electrode 12 were formed; and the resulting wafer was cut out into 330 μm-square LED chips. An LED chip created as described above was installed on a common bullet-shape LED stem having a diameter of 5 mm, and the resulting assembly was used as an evaluation sample.

Figure 7:
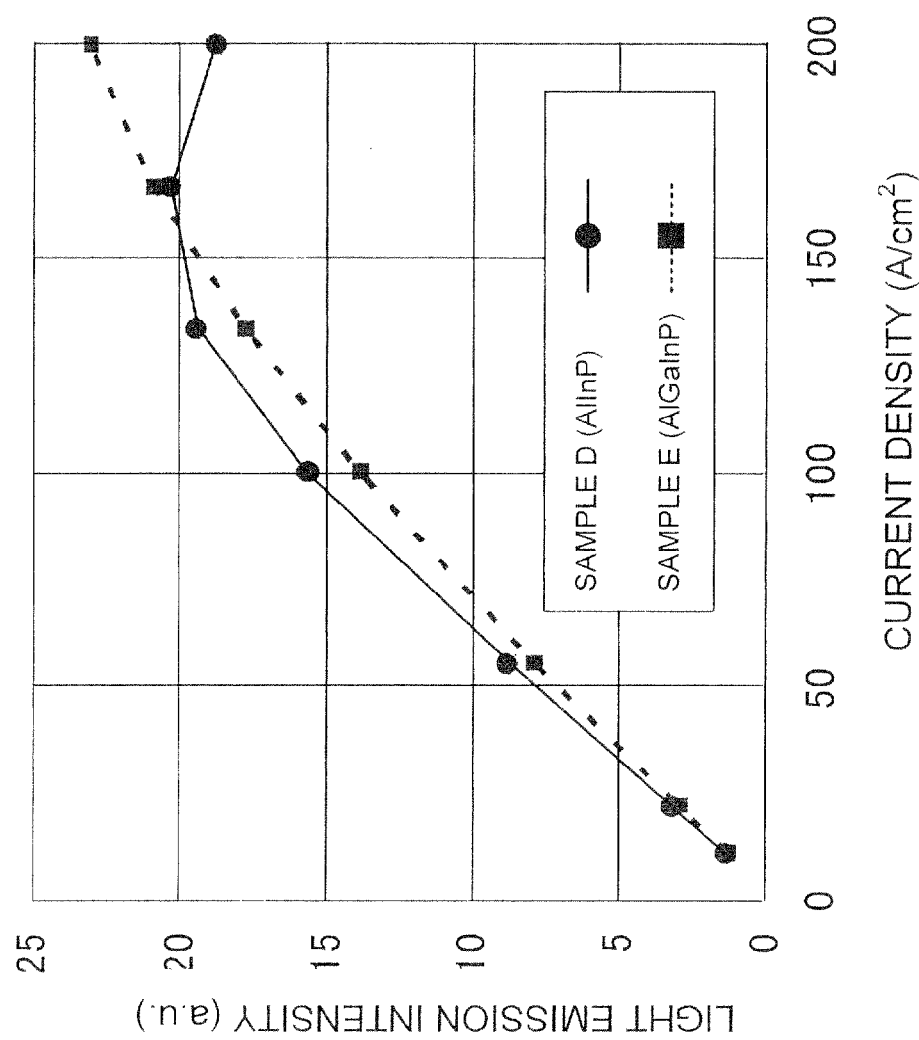
FIG. 7 shows current-light output characteristics of two sample types between which the p-clad layer configuration mutually differs.

FIG. 7 shows the result of studying the current-light output characteristics of sample D (solid line) and sample E (broken line). In FIG. 7, the horizontal axis represents current density, and the vertical axis represents relative values of the light emission intensity. In sample D, the light output in a low-current-density region is about 10% higher than that in sample E. However, once the current density exceeds 100

A/cm², the linearity decreases, and the light output saturates at about 140 A/cm². In contrast, in sample E, although the light output in a low-current-density region is lower than that of sample D, linearity is maintained even after the current density exceeds 100 A/cm², and the light output in a region in which the current density is equal to or greater than 150 A/cm² exceeds that of sample D. The saturation point of the light output of sample E is presumed to reach 235 A/cm².

It is presumed that the above results were obtained for the following reason. Specifically, it is thought that since AlInP has a higher mobility than that of AlGaInP, in sample D, the current distribution on the p-side improved, and a relatively high light output was obtained even in a region of low current density. On the other hand, it is thought that since AlInP has a lower barrier for blocking electrons compared to that of AlGaInP, electron overflow occurred in a region of high current density, reducing the emission efficiency. In other words, AlInP is beneficial for promotion of current-spreading, and AlGaInP is beneficial for minimizing carrier overflow. In order to minimize carrier overflow in an effective manner, it is preferable that the value of y in $(Al_yGa_{1-y})_{0.5}In_{0.5}P$ is set within a range of $(0.6 \leq y \leq 0.7)$.

With the foregoing in view, the inventors investigated the layer configuration of the p-clad layer 44 in order for the p-clad layer 44 to have both a function of promoting current-spreading by AlInP, and a carrier-blocking function (or overflow-minimizing function) of AlGaInP. The p-clad layer 44 was configured as a two-layer configuration, where $Al_{0.5}In_{0.5}P$ was used for a layer adjacent to the current-spreading layer 42 (i.e., first p-clad layer), and $(Al_{0.7}Ga_{0.3})_{0.5}In_{0.5}P$ was used for a layer adjacent to the active layer 46 (i.e., second p-clad layer). The proportion of the layer thickness of each of the layers was varied, and characteristics were evaluated. 1 μm was used for the total layer thickness of the first p-clad layer and the second p-clad layer.

Figure 8:
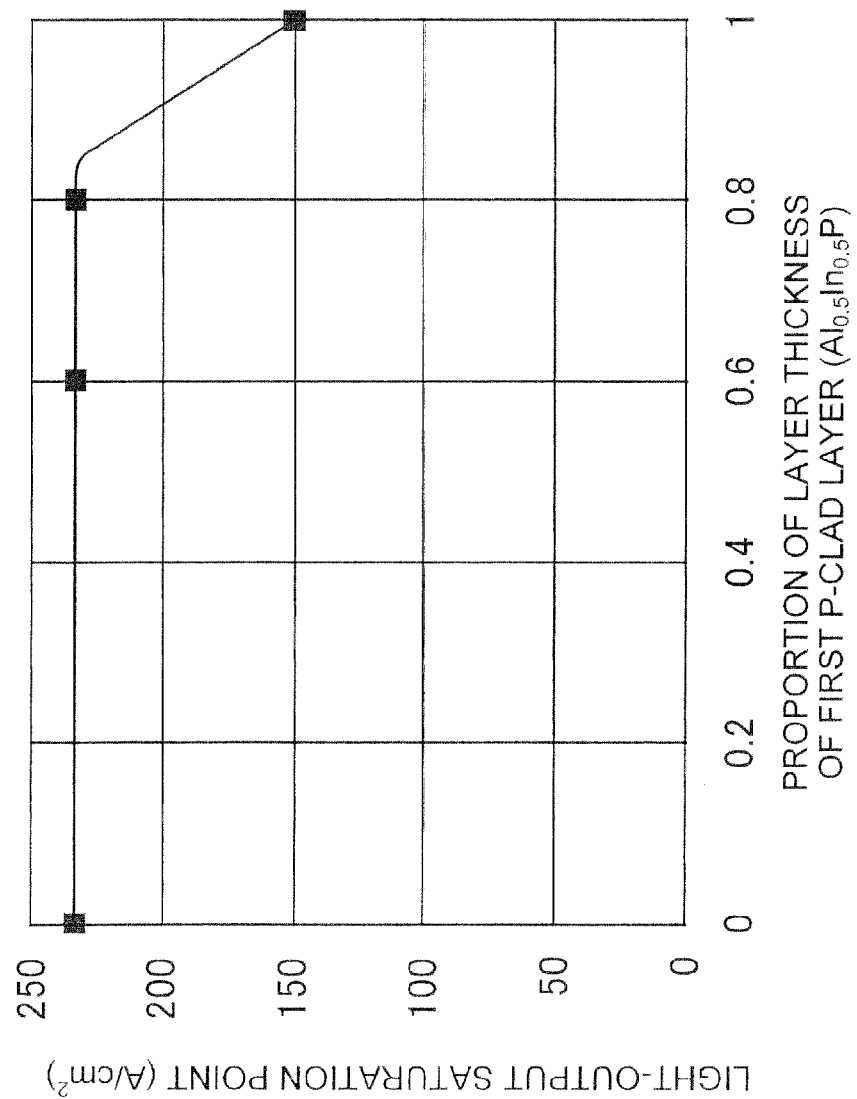
FIG. 8 shows a relationship between the proportion of the layer thickness of a first p-clad layer and the light output saturation point.

FIG. 8 shows the result of studying the relationship between the proportion of the thickness of the first p-clad layer ($Al_{0.5}In_{0.5}P$) adjacent to the current-spreading layer 42 and the light output saturation point. The light output saturation point is a value representing the current density at which the light output saturates, and was used as an indicator value for the linearity of current-light output characteristics. In other words, a higher light output saturation point can be determined to represent better linearity. It was observed that the light output saturation point is constant until the proportion of the layer thickness of the first p-clad layer ($Al_{0.5}In_{0.5}P$) is reaches 80%, and rapidly decreases when 80% is exceeded. In other words, when the proportion of the layer thickness of the second p-clad layer (($Al_{0.7}Ga_{0.3})_{0.5}In_{0.5}P$) adjacent to the active layer 46 falls below 20%, the linearity of the current-light output characteristics decreases. It can be understood from the above that having the proportion of the layer thickness of the second p-clad layer (($Al_{0.7}Ga_{0.3})_{0.5}In_{0.5}P$) be equal to or greater than 20% causes the p-clad layer 44 to exert a carrier block function in an effective manner.

Figure 9:
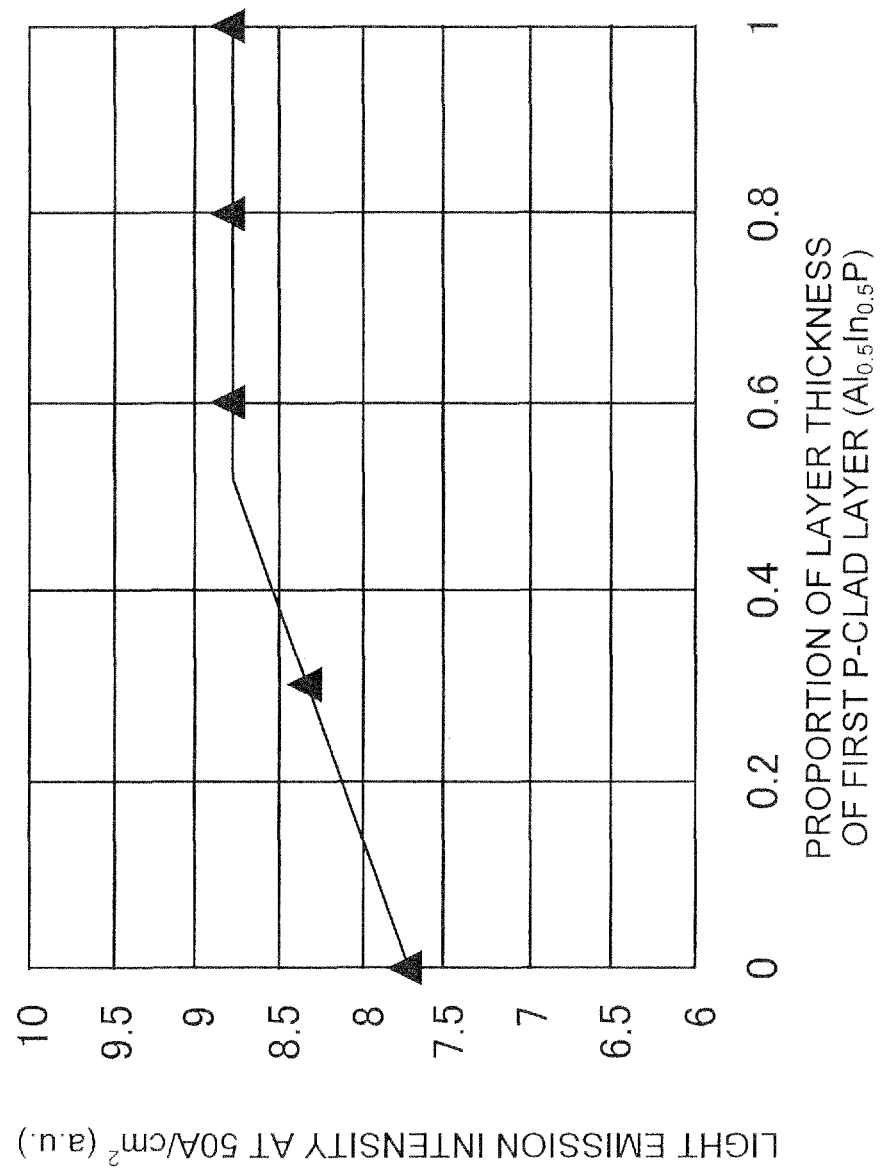
FIG. 9 shows a relationship between the proportion of the layer thickness of the first p-clad layer and light emission intensity.

FIG. 9 shows the result of studying the relationship between the proportion of the layer thickness of the first p-clad layer ($Al_{0.5}In_{0.5}P$) adjacent to the current-spreading layer 42 and the light emission intensity at a low current density (50 A/cm²). It was observed that as the proportion of the layer thickness of the first p-clad layer ($Al_{0.5}In_{0.5}P$) increases, the light emission intensity increases; and that the light output becomes substantially constant when the proportion of the layer thickness exceeds 50%. It can be understood from the above that having the proportion of the layer thickness of the first p-clad layer ($Al_{0.5}In_{0.5}P$) be equal to or greater than 50% causes the p-clad layer 44 to exert, in an effective manner, a function of promoting current-spreading.

The above results show that setting, in the p-clad layer 44, the proportion of the layer thickness of the first p-clad layer ($Al_{0.5}In_{0.5}P$) to within a range of 50% to 80% and the proportion of the layer thickness of the second p-clad layer (($Al_{0.7}Ga_{0.3})_{0.5}In_{0.5}P$) to within a range of 20% to 50% makes it possible to address both the light emission intensity in a low-current-density region and the linearity of light output in a high-current-density region.

Figure 10:
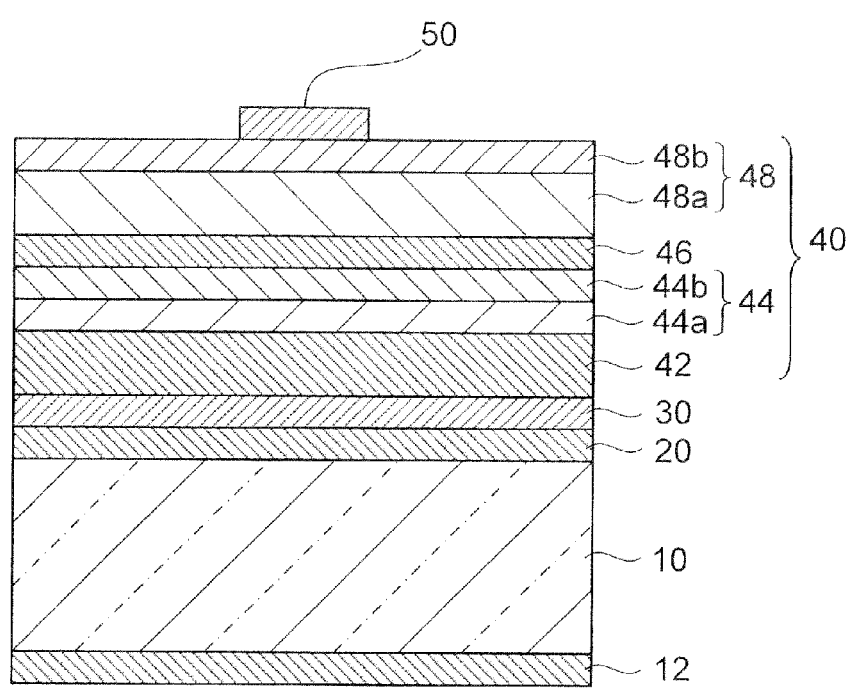
FIG. 10 is a cross-section view showing the structure of the semiconductor light-emitting element according to the embodiment of the invention.

FIG. 10 shows a typical configuration of the semiconductor light-emitting element 1 according to the embodiment of the invention, derived from the above results of investigating the layer configuration of the n-clad layer 48 and the p-clad layer 44.

The semiconductor film 40 is supported by the support substrate 10 made from electroconductive Si. The reverse-surface electrode 12 is provided to a reverse surface (i.e., a surface opposite to a surface that is bonded to the semiconductor film 40) of the support substrate 10. The junction layer 20 and the reflective electrode layer 30 are provided between the semiconductor film 40 and the support substrate 10. A more detailed configuration of the junction layer 20 and the reflective electrode layer 30 is as shown in FIGS. 3 and 4.

The current-spreading layer 42 provided on the reflective electrode layer 30 is configured from GaP having a carrier density of $3 \times 10^{18}$ cm$^{-3}$, a thickness of approximately 1 μm, and a p-type conductivity type.

A first p-clad layer 44a provided on the current-spreading layer 42 is configured from $Al_{0.5}In_{0.5}P$ having a carrier density of $2 \times 10^{17}$ cm$^{-3}$, a thickness of approximately 0.8 μm, and a p-type conductivity type.

A second p-clad layer 44b provided on the first p-clad layer 44a is configured from $(Al_{0.7}Ga_{0.3})_{0.5}In_{0.5}P$ having a carrier density of $2 \times 10^{17}$ cm$^{-3}$, a thickness of approximately 0.2 μm, and a p-type conductivity type.

Configuring the p-clad layer 44, which comprises the first p-clad layer 44a and the second p-clad layer 44b, so that the proportion of the layer thickness of the first p-clad layer 44a is 50% to 80% and the proportion of the layer thickness of the second p-clad layer 44b is 20% to 50% makes it possible to realize both the light emission intensity in a low-current-density region and the linearity of light output in a high-current-density region. The carrier density of the p-clad layer 44 is preferably $2 \times 10^{17}$ cm$^{-3}$ to $1 \times 10^{18}$ cm$^{-3}$.

The active layer 46 provided on the second p-clad layer 44b has a multiple quantum well structure in which a well layer having a thickness of approximately 10 nm and being made from undoped $(Al_{0.1}Ga_{0.9})_{0.5}In_{0.5}P$, and a barrier layer having a thickness of approximately 10 nm and being made from undoped $(Al_{0.5}Ga_{0.5})_{0.5}In_{0.5}P$, are repeatedly layered for 20 cycles.

A first n-clad layer 48a provided on the active layer 46 is configured from $Al_{0.5}In_{0.5}P$ having a carrier density of $1 \times 10^{18}$ cm$^{-3}$, a thickness of approximately 1.6 μm, and an n-type conductivity type.

A second n-clad layer 48b provided on the first n-clad layer 48a is configured from $(Al_{0.7}Ga_{0.3})_{0.5}In_{0.5}P$ having a carrier density of $1 \times 10^{18}$ cm$^{-3}$, a thickness of 0.4 μm, and an n-type conductivity type.

Configuring the n-clad layer 48, which comprises the first n-clad layer 48a and the second n-clad layer 48b, so that the total layer thickness is equal to or greater than 2 μm and the carrier density is $1 \times 10^{18}$ cm$^{-3}$ to $5 \times 10^{18}$ cm$^{-3}$ makes it possible for the n-clad layer 48 to function as a current-spreading layer in an effective manner and contribute towards improving light emission efficiency. Also, having the proportion of the layer thickness of the first n-clad layer 48a in the n-clad layer 48 be equal to or greater than 80% makes it possible to improve the linearity of current-light output characteristics. Also, configuring the layer thickness of the second n-clad layer 48b so as to be equal to or greater than 100 nm makes it possible to obtain a resistance against oxidation and resistance against etching performed when the GaAs substrate is being removed.

The upper-surface electrode 50 is provided on the surface of the second n-clad layer 48b, which functions as the light extraction surface. A detailed configuration of the upper-surface electrode 50 is as shown in FIGS. 3 and 4.

A method for manufacturing the semiconductor light-emitting element 1 having the above-mentioned configuration will now be described with reference to FIGS. 11A through 11D and FIGS. 12A through 12C.

[Formation of the Semiconductor Film]

Figure 11A:
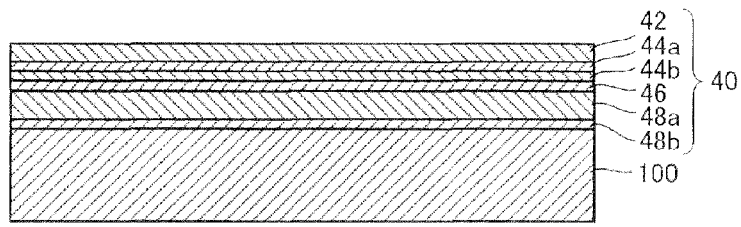
FIGS. 11A to 11D are cross-section views showing a method for manufacturing the semiconductor light-emitting element according to the embodiment of the invention.

The semiconductor film 40 was formed by a metal organic chemical vapour deposition (MOCVD) method. A GaAs substrate, inclined by 15° to the [011] direction relative to the (100) plane, was used as a growth substrate 100 used for crystal growth of the semiconductor film 40. The second n-clad layer 48b made from $(Al_{0.7}Ga_{0.3})_{0.5}In_{0.5}P$ having an Si-doping density (or carrier density) of $1\times10^{18}$ cm$^{-3}$, a thickness of approximately 0.4 μm, and an n-type conductivity type was formed on the growth substrate 100. Next, the first n-clad layer 48a made from $Al_{0.5}In_{0.5}P$ having a Si-doping density (or carrier density) of $1\times10^{18}$ cm$^{-3}$, a thickness of approximately 1.6 μm, and an n-type conductivity type was formed on the second n-clad layer 48b. Next, the active layer 46 was formed on the first n-clad layer 48a, the active layer 46 having a multiple quantum well structure in which a well layer having a thickness of approximately 10 nm and being made from undoped $(Al_{0.1}Ga_{0.9})_{0.5}In_{0.5}P$, and a barrier layer having a thickness of approximately 10 nm and being made from undoped $(Al_{0.5}Ga_{0.5})_{0.5}In_{0.5}P$, were repeatedly layered for 20 cycles. Then, the second p-clad layer 44b made from $(Al_{0.7}Ga_{0.3})_{0.5}In_{0.5}P$ having an Mg-doping density (carrier density) of $2\times10^{17}$ cm$^{-3}$, a thickness of approximately 0.2 μm, and a p-type conductivity type was formed on the active layer 46. Then, the first p-clad layer 44a made from $Al_{0.5}In_{0.5}P$ having an Mg doping density (carrier density) of $2\times10^{17}$ cm$^{-3}$, a thickness of approximately 0.8 μm and a p-type conductivity type was formed on the second p-clad layer 44b. Next, the current-spreading layer 42 made from GaP having an Mg-doping density (carrier density) of $3\times10^{18}$ cm$^{-3}$, a thickness of approximately 1 μm, and a p-type conductivity type was formed (FIG. 11A).

Phosphine ($PH_3$) was used as a group-V material; and organic metals, namely trimethyl gallium (TMG), trimethyl aluminum (TMA), and trimethyl indium (TMI), were used as group-III materials. Silane ($SiH_4$) was used as an n-type dopant, and bis(cyclopentadienyl)magnesium ($Cp_2Mg$) was used as a p-type dopant. Hydrogen was used as a carrier gas, and the V/III ratio was 30 to 200. For the AlGaInP layer, the growth temperature was 670° C., and for the GaP layer, the growth temperature was 770° C. The growth pressure was 10 kPa.

[Forming the Reflective Electrode Layer and Junction Layer]

Figure 11B:
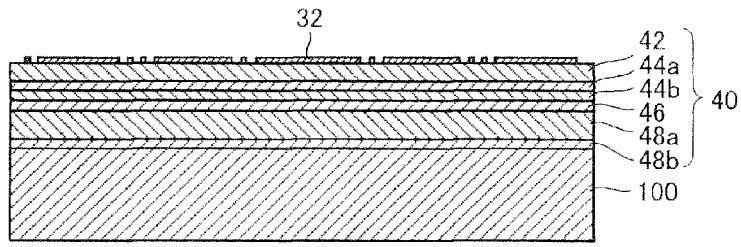

An $SiO_2$ film configuring the dielectric layer 32 was formed on the current-spreading layer 42 using plasma CVD. Next, a resist mask was formed on the $SiO_2$ film; then, buffered hydrofluoric acid (BHF) was used to perform partial etching on the $SiO_2$ film, whereby patterning was applied to the $SiO_2$ film so as to correspond with the pattern of the line electrodes 31a and the dot electrodes 31b. An opening portion was formed at each portion at which the $SiO_2$ film has been removed. The current-spreading layer 42 is exposed in each of the opening portions (FIG. 11B). Thermal CVD or sputtering can also be used to form the $SiO_2$ film. Dry etching can also be used as a method for etching the $SiO_2$ film. A dielectric material other than $SiO_2$, such as $Si_3N_4$ or $Al_2O_2$, can also be used as a material for the dielectric layer 32.

Figure 11C:
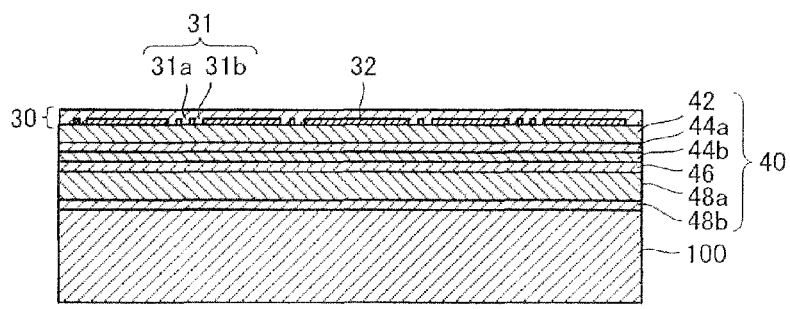

Next, EB vapor deposition was used to form the reflective electrode 31, which is made from AuZn and has a thickness of about 300 nm, on the dielectric layer 32. The reflective electrode 31 is in contact with the current-spreading layer 42 through the opening portions formed on the dielectric layer 32 by the previous etching process. The reflective electrode 31 is divided by the dielectric layer 32 into the line electrodes 31a and the dot electrodes 31b. The dielectric layer 32 and the reflective electrode 31 configure the reflective electrode layer 30 (FIG. 11C).

Figure 11D:
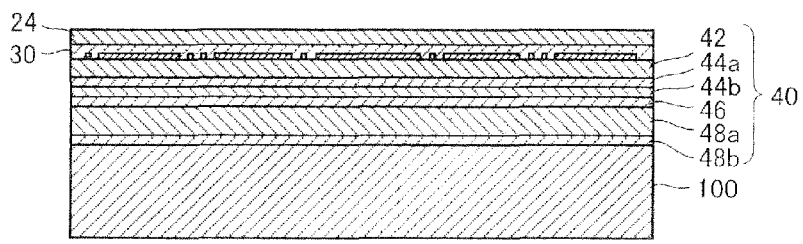

Next, sputtering is used to perform sequential deposition of TaN (thickness: 100 nm), TiW (thickness: 100 nm), and TaN (thickness: 100 nm) on the reflective electrode layer 30, and thus the barrier layer 24 was formed. Then, a heat treatment was applied under a nitrogen atmosphere of approximately 500° C. An ohmic contact is thereby formed between the reflective electrode 31 and the current-spreading layer 42. Next, EB vapor deposition is used to sequentially form Ni (300 nm) and Au (30 nm) on the barrier layer 24 so that a junction layer (not shown) was formed (FIG. 11D). The barrier layer 24 may also be configured from a single layer or two or more layers containing Ta, Ti, W, another metal with a high melting point, or a nitride thereof. Other than sputtering, EB vapor deposition may also be used to form the barrier layer 24.

[Joining the Support Substrate]

An electroconductive Si substrate was used as the support substrate for supporting the semiconductor film 40. EB vapor deposition was used for deposition of Pt on both sides of the support substrate 10, and to form the reverse-surface electrode 12 and the ohmic layer 21 having a thickness of approximately 200 nm. Next, sputtering was used for deposition of Ti (thickness: 150 nm) to form the adhesion layer 22, on the ohmic layer 21. Next, sputtering was used for sequential deposition of Ni (thickness: 100 nm) and AuSn (thickness: 600 nm), and form the eutectic bonding layer 23, on the adhesion layer 22.

Figure 12A:
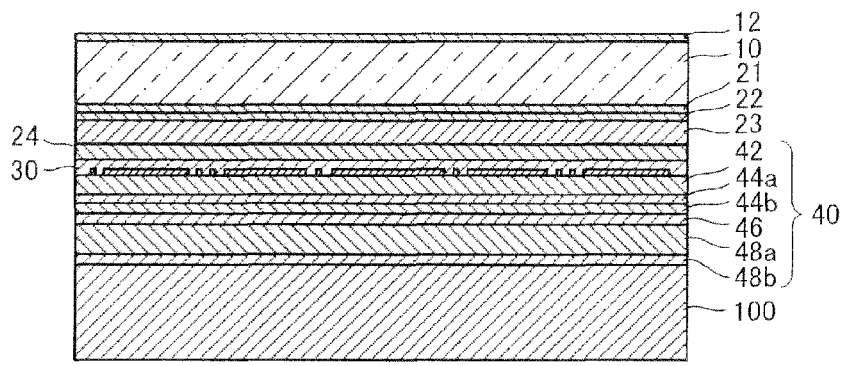
FIGS. 12A to 12C are cross-section views showing a method for manufacturing the semiconductor light-emitting element according to the embodiment of the invention.
Figure 12B:
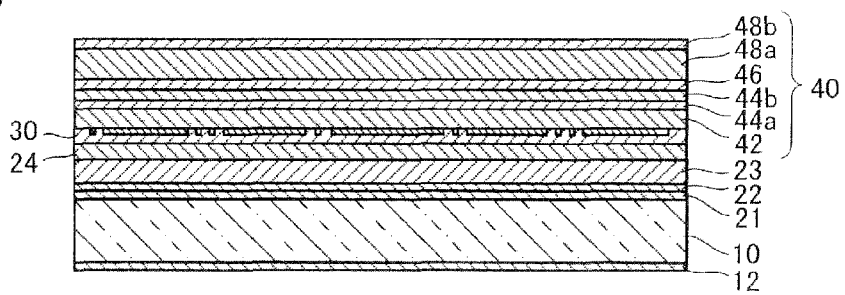

Next, the semiconductor film 40 and the support substrate 10 were bonded by thermal compression bonding. The junction layer on the semiconductor-film-40 side and the eutectic bonding layer 23 on the upper-surface-electrode side 50 were brought into intimate contact and held for ten minutes under a nitrogen atmosphere of 1 MPa and 330° C. A eutectic bonding material (AuSn) contained in the eutectic bonding layer 23 on the semiconductor-film-40 side melts and forms AuSnNi with the junction layer on the semiconductor-film-40 side (Ni/Au), whereby the support substrate 10 and the semiconductor film 40 are bonded to each other (FIG. 12A).

[Removal of the Growth Substrate]

The growth substrate 100, which was used for crystal growth for the semiconductor film 40, was removed by wet etching using a liquid mixture of ammonia water and hydrogen peroxide. Dry etching, mechanical polishing, or chemical mechanical polishing (CMP) may also be used to remove the growth substrate 100 (FIG. 2B).

[Formation of the n-Electrode]

Figure 12C:
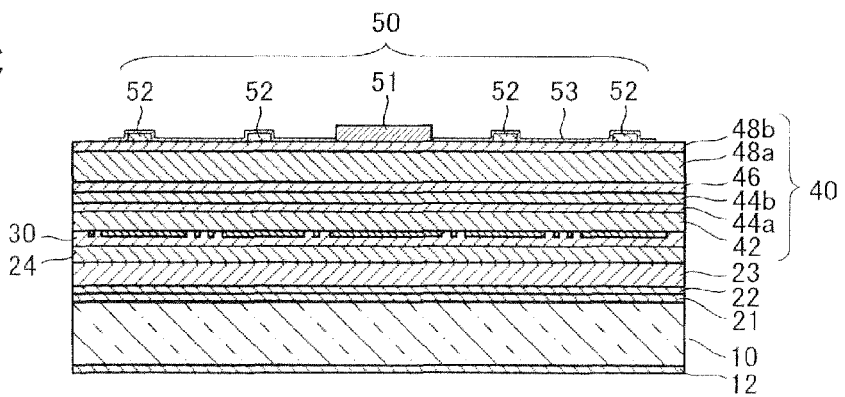

The Schottky electrode 51, the ohmic electrodes 52, and the connection wiring 53 were formed on the second n-clad layer 48b, which had been uncovered or exposed by the removal of the growth substrate 100. AuGeNi, which forms an ohmic contact with the second n-clad layer 48b, was deposited on the second n-clad layer 48b using EB vapor deposition; then, patterning was performed using the lift-off method to form the ohmic electrodes 52. Next, Ti (thickness: 100 nm), which forms a Schottky contact with the second n-clad layer 48b, was deposited using EB vapor deposition on the second n-clad layer 48b, and Au (thickness: 1.5 μm) was further deposited on the Ti. Then, patterning was performed using the lift-off method to form the Schottky electrode 51 and the connection wiring 53. Next, heat treatment was applied under a nitrogen atmosphere of 400° C. in order to promote formation of an ohmic contact between the second n-clad layer 48b and the ohmic electrodes 52. AuGe, AuSn, AuSnNi, or another material may be used for the ohmic electrodes 52. Ta, W, an alloy thereof, or a nitride thereof can also be used as the material for the Schottky electrode 51 (FIG. 12C). The semiconductor light-emitting element 1 is completed through the steps described above.

As can be seen from the above description, the semiconductor light-emitting element 1 according to the present embodiment comprises, as the support substrate 10, an Si substrate having a higher thermal conductivity than that of the GaAs substrate used for crystal growth, whereby heat-radiating performance is improved. Driving at a high current therefore becomes possible. Also, arranging the upper-surface electrode 50 and the reflective electrode 31 sandwiching the semiconductor film 40 so that no overlapping is present between each other when viewed along the stacking direction of the semiconductor film 40 (i.e., the direction vertical to the semiconductor film 40), i.e., when the upper-surface electrode 50 and the reflective electrode 31 are projected onto a plane parallel to the semiconductor film 40, makes it possible to achieve uniformity in the current density distribution in the semiconductor film 40 and prevent current concentration. It thereby becomes possible to reduce the thickness of the semiconductor film 40.

In the semiconductor light-emitting element 1 according to the present embodiment, the n-clad layer 48 is configured from the first n-clad layer made from n-type $Al_{0.5}In_{0.5}P$ and provided adjacent to the active layer 46, and the second n-clad layer 48b made from n-type $(Al_{0.7}Ga_{0.3})_{0.5}In_{0.5}P$ and provided on the first n-clad layer 48a. The total thickness of the first n-clad layer 48a and the second n-clad layer 48b is set to equal or greater than 2 μm, and the carrier density of each is set to be in the range from $1\times10^{18}$ cm$^{-3}$ to $5\times10^{18}$ cm$^{-3}$. The n-clad layer 48 can thereby function as a current-spreading layer in an effective manner. Therefore, even in an instance in which the GaAs substrate is removed, the uniformity of current density distribution in the semiconductor film 40 is not impaired, and it is possible to contribute to the improvement of emission efficiency. Also, in the n-clad layer 48, the proportion of the layer thickness of the first n-clad layer 48a is equal to or greater than 80%, and the linearity of the current-light output characteristics is therefore improved. Also, since the thickness of the second n-clad layer 48b is equal to or greater than 100 nm, the n-clad layer 48 can be made resistant to oxidation and etching performed when the GaAs substrate is removed.

In the semiconductor light-emitting element 1 according to the present embodiment, the p-clad layer 44 is configured from the first p-clad layer 44a made from p-type $Al_{0.5}In_{0.5}P$ and provided adjacent to the current-spreading layer 42, and the second n-clad layer 48b made from p-type $(Al_{0.7}Ga_{0.3})_{0.5}In_{0.5}P$ and provided on the first p-clad layer 44a. In the p-clad layer 44, the proportion of the layer thickness of the first p-clad layer 44a is in the range of 50% to 80% and the proportion of the layer thickness of the second p-clad layer 44b is in the range of 20% to 50%, making it possible to address both the light emission intensity in a low-current-density region and linearity of current-light output characteristics in a high-current-density region.

According to the configuration of the n-clad layer 48 and the p-clad layer 44 as described above, it is possible to improve the linearity of current-light output characteristics in a high-current-density region. Therefore, in combination with a support substrate having a higher thermal conductivity than the GaAs substrate or with an electrode structure that can promote current-spreading, an adequate degree of performance can be demonstrated, and satisfactory output characteristics can be obtained in a high-current region of 100 mA or greater.

The n-clad layer 48, the p-clad layer 44, and the active layer 46 must be grown under the lattice-matching conditions to the GaAs substrate, which is the substrate used for growth. The lattice-matching conditions to the GaAs substrate vary according to growth temperature. In order for each of the layers to be lattice-matched to the GaAs substrate, the value of x is adjusted in $Al_xIn_{1-x}P$, $(Al_yGa_{1-y})_xIn_{1-x}P$. For example, in an instance in which the semiconductor film 40 is grown at 500° C. to 700° C., setting the range of x to 0.45≤x≤0.55 makes it possible to make the layers lattice-matched to the GaAs substrate. Even in an instance in which x is within this range, it is possible to obtain the effect of improving the linearity of the current-light output characteristics as with the embodiment described above.

With regards to the active layer, as long as the thickness is equal to or less than a critical thickness, there is no need for the active layer to be lattice-matched to the GaAs substrate, and there is no need for the range of x to be 0.45≤x≤0.55. A preferable composition range for the active layer, taking the critical thickness into account, is $(Al_yGa_{1-y})_xIn_{1-x}P$ (0.4≤x≤0.6, 0≤y≤0.7).

In the above-mentioned embodiment, $SiH_4$ (silane) was used as a dopant in order to obtain an n-type conductivity type. However, DeTe (diethyl tellurium) or $H_2Se$ (hydrogen selenide) may also be used. Also, in the above-mentioned embodiment, $Cp_2Mg$ (bis(cyclopentadienyl)magnesium) was used in order to obtain a p-type conductivity type. However, DMZn (dimethyl zinc) may also be used. The effect of the above-mentioned embodiment can be obtained irrespective of the type of dopant.

Also, in the above-mentioned embodiment, the active layer 46 was configured as a quantum well structure (Al composition 10%) for red light emission; however, a similar effect can be obtained if the thickness of the well layer or the barrier layer or the frequency is changed. The active layer may be a bulk active layer comprising a single layer of $(Al_yGa_{1-y})_xIn_{1-x}P$ (0.4≤x≤0.6, 0≤y≤0.7). Also, an effect similar to that according to the above-mentioned embodiment can be obtained when the Al composition of the well layer is changed so as to cause yellow light emission (wavelength 590 nm) or crimson light emission (wavelength 660 nm). Similarly, in relation to the off-angle of the substrate, even if the crystal growth for the semiconductor film is performed using a GaAs substrate with a different off-angle and off-direction, the effect of the above-mentioned embodiment can be obtained. The inventors have confirmed that an effect similar to that according to the above-mentioned embodiment can also be obtained in an instance in which a GaAs substrate inclined by 4° to the [011] direction relative to the (100) plane, is used.

Although the current-spreading layer was configured from GaP in the above-mentioned embodiment, the current-spreading layer need only be transparent relative to the emission wavelength. For example, In may be added and $Ga_{1-z}In_zP$ ($0 \leq z \leq 0.1$) used. An effect similar to that according to the above-mentioned embodiment can also be obtained in this instance.

In the above-mentioned embodiment, an electroconductive Si substrate was used as the support substrate. However, this is not limiting; the support substrate need only be configured from a material having a higher thermal conductivity than that of the GaAs substrate used for crystal growth, and may be configured from Cu, Ge, an Cu—W alloy, SiC, or another material. The support substrate may also be transparent with respect to the emission wavelength; for example, a GaP substrate or a GaN substrate may also be used.

In the above-mentioned embodiment, a dielectric layer and a reflective electrode are provided between the support substrate and the semiconductor film. However, when a transparent substrate is used as the support substrate, it is not necessary to provide the dielectric layer and the reflective electrode. Also, instead of the reflective electrode of the above-mentioned embodiment, the semiconductor film may be partially etched from the n-clad-layer side, a portion of the first p-clad layer may be exposed, and an ohmic electrode may be formed on a surface of the first p-clad layer thus exposed. Also, in an instance in which the support substrate is electroconductive, an electrode may be formed on a back surface of the support substrate.

Figure 13:
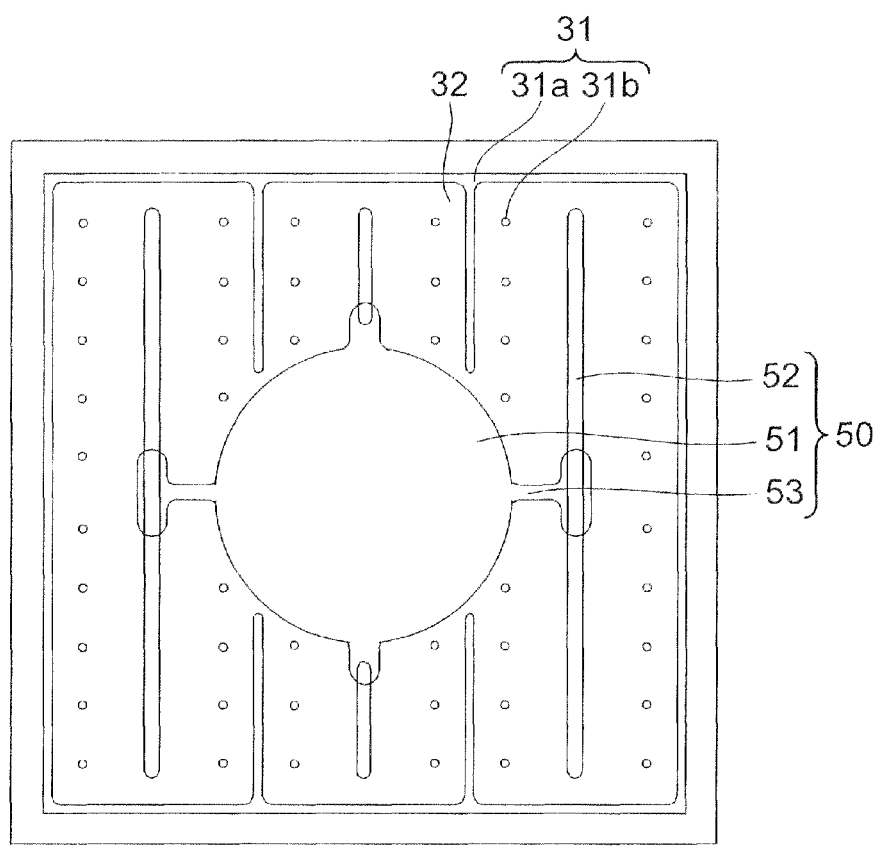
FIG. 13 is a plan view showing an arrangement of the upper-surface electrode and the reflective electrode according to the embodiment of the invention.

FIG. 13 is a plan view in which the upper-surface electrode 50 and the reflective electrode layer 31, whose respective pattern configuration has been modified, are projected onto a single plane. As with the electrode configuration shown in FIG. 4, a reflective electrode 31 comprising line electrodes 31a and dot electrodes 31b is provided on a light-reflecting-surface side, and a upper-surface electrode 50 comprising a Schottky electrode 51, ohmic electrodes 52, and connection wiring 53 is provided on a light-extraction-surface side. The upper-surface electrode 50 and the reflective electrode 31 are arranged at a position at which no overlapping is present between each other in the stacking direction of the semiconductor film 40 or when they are projected on a single plane. An effect similar to the above-mentioned embodiment can again be obtained according to an electrode pattern thus modified.

Figure 14:
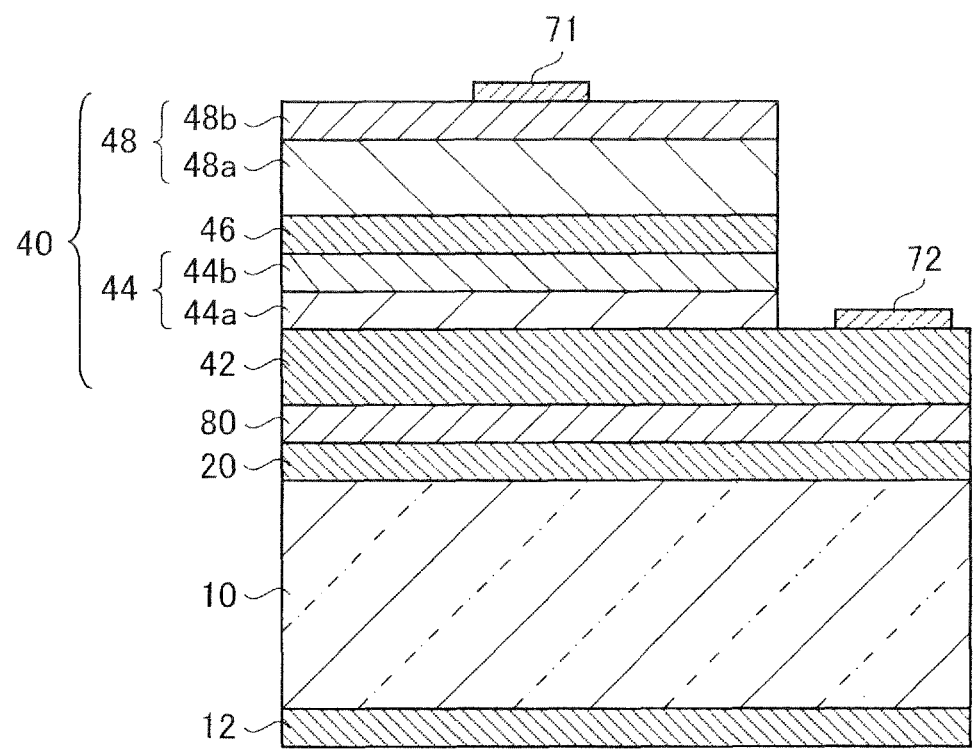
FIG. 14 is a cross-section view showing a configuration of a semiconductor light-emitting element according to the embodiment of the invention.

Arranging the upper-surface electrode 50 and the reverse-surface electrode 12 sandwiching the semiconductor film 40 in a non-overlapping manner as shown in FIGS. 4 and 12 causes the current density distribution in the semiconductor film 40 to be made uniform. Therefore, the effect of improving the linearity of current-light output characteristics due to the clad layer configuration according to the present embodiment is made more prominent. However, the effect of improving the linearity of current-light output characteristics due to the clad layer configuration according to the present embodiment can still be obtained even if such an electrode configuration is not present. This is because the clad layer configuration according to the present embodiment is present in order to block carriers in an effective manner and minimize overflow. This effect is obtained independently with respect to the effect of promoting current-spreading of the electrode configuration. For example, the clad layer configuration according to the present embodiment can also be applied to a so-called flip chip structure, in which an n-electrode 71 and a p-electrode 72 are provided on a same-surface side of the semiconductor film 40 as shown in FIG. 14. When a flip chip structure is employed, a reflective insulating layer 80 made from $SiO_2$ or a similar material is provided, instead of the reflective electrode layer, between the support substrate 10 and the semiconductor film 40.

In the above-mentioned embodiment, $SiO_2$ is used as the dielectric layer 32 configuring the reflective electrode layer 30. However, the dielectric layer 32 may be substituted with an electroconductive layer made from ITO (Indium Tin Oxide). In such an instance, since ITO is electroconductive, there is no need to form a contact window for establishing contact between the reflective electrode 31 and the semiconductor film 40.

This application is based on Japanese Patent Application No. 2011-052844 which is hereby incorporated by reference.

What is claimed is:

1. A semiconductor light-emitting element including a support substrate and a semiconductor film provided on the support substrate, wherein the semiconductor film includes:
   a current-spreading layer provided on the support substrate and made from GaInP or GaP having a p-type conductivity;
   a first p-clad layer provided on the current-spreading layer and made from AlInP having a p-type conductivity; and
   a second p-clad layer provided on the first p-clad layer and made from AlGaInP having a p-type conductivity;
   an active layer including at last one layer made from GaInP or AlGaInP, the active layer being provided on the second p-clad layer;
   a first n-clad layer provided on the active layer and made from AlInP having a carrier density of $1 \times 10^{18}$ $cm^{-3}$ to $5 \times 10^{18}$ $cm^{-3}$ and an n-type conductivity; and
   a second n-clad layer provided on the first n-clad layer and made from AlGaInP having a carrier density of $1 \times 10^{18}$ $cm^{-3}$ to $5 \times 10^{18}$ $cm^{-3}$ and an n-type conductivity; wherein
   the proportion of the layer thickness of the first p-clad layer, in relation to the layer thickness of an entire p-clad layer comprising the first p-clad layer and the second p-clad layer, is 50% to 80%;
   the layer thickness of an entire n-clad layer comprising the first n-clad layer and the second n-clad layer is equal to or greater than 2 μm;
   the proportion of the layer thickness of the first n-clad layer in relation to the layer thickness of the entire n-clad layer is equal to or greater than 80%; and
   the layer thickness of the second n-clad layer is equal to or greater than 100 nm.

2. The semiconductor light-emitting element according to claim 1, wherein
   the current-spreading layer is made from $Ga_{1-z}In_zP$ ($0 \leq z \leq 0.1$);
   the first p-clad layer is made from $Al_xIn_{1-x}P$ ($0.45 \leq x \leq 0.55$);
   the second p-clad layer is made from $(Al_yGa_{1-y})_xIn_{1-x}P$ ($0.45 \leq x \leq 0.55$, $0.6 \leq y \leq 0.7$);
   the active layer includes at least one layer of $(Al_yGa_{1-y})_xIn_{1-x}P$ ($0.4 \leq x \leq 0.6$, $0 \leq y \leq 0.7$);
   the first n-clad layer is made from $Al_xIn_{1-x}P$ ($0.45 \leq x \leq 0.55$); and
   the second n-clad layer $(Al_yGa_{1-y})_xIn_{1-x}P$ ($0.45 \leq x \leq 0.55$, $0.3 \leq y \leq 0.7$).

3. The semiconductor light-emitting element according to claim 1, wherein the support substrate is made from a material having a higher thermal conductivity than that of GaAs.

4. The semiconductor light-emitting element according to claim 1, wherein a reflective electrode that makes ohmic contact with the semiconductor film is formed between the support substrate and the semiconductor film.

5. The semiconductor light-emitting element according to claim 4, further including an ohmic electrode provided on a surface of the second n-clad layer, the ohmic electrode making ohmic contact with the second n-clad layer; wherein the ohmic electrode and the reflective electrode are provided so as not to overlap one another when viewed along the layering direction of the semiconductor film.

6. A method for manufacturing a semiconductor light-emitting element, comprising the steps of:
- forming, on a GaAs substrate, a second n-clad layer made from AlGaInP having a carrier density of $1\times10^{18}$ cm$^{-3}$ to $5\times10^{18}$ cm$^{-3}$ and an n-type conductivity;
- forming, on the second n-clad layer, a first n-clad layer made from AlInP having a carrier density of $1\times10^{18}$ cm$^{-3}$ to $5\times10^{18}$ cm$^{-3}$ and an n-type conductivity type;
- forming, on the first n-clad layer, an active layer including at least one layer made from GaInP or AlGaInP;
- forming, on the active layer, a second p-clad layer made from AlGaInP having a p-type conductivity;
- forming, on the second p-clad layer, a first p-clad layer made from AlInP having a p-type conductivity;
- forming, on the first p-clad layer, a current-spreading layer made from GaInP or GaP having a p-type conductivity;
- forming, on the current-spreading layer, a reflective electrode layer having a light-reflecting structure;
- bonding, onto the reflective electrode layer, a support substrate made from a material having a higher thermal conductivity than that of the GaAs substrate;
- removing the GaAs substrate; and
- forming an upper-surface electrode on a surface of the second n-clad layer, the surface being exposed by the removal of the GaAs substrate; wherein the proportion of the layer thickness of the first p-clad layer, in relation to the layer thickness of an entire p-clad layer comprising the first p-clad layer and the second p-clad layer, is 50% to 80%;

the layer thickness of an entire n-clad layer comprising the first n-clad layer and the second n-clad layer is equal to or greater than 2 μm;

the proportion of the layer thickness of the first n-clad layer in relation to the layer thickness of the entire n-clad layer is equal to or greater than 80%; and the layer thickness of the second n-clad layer is equal to or greater than 100 nm.

\* \* \* \* \*